United States Patent
Kosaka et al.

(10) Patent No.: US 11,073,756 B2
(45) Date of Patent: *Jul. 27, 2021

(54) PHOTOMASK BLANK, PHOTOMASK BLANK MAKING METHOD, AND PHOTOMASK MAKING METHOD

(71) Applicant: Shin-Etsu Chemical Co., Ltd., Tokyo (JP)

(72) Inventors: Takuro Kosaka, Joetsu (JP); Hideo Kaneko, Joetsu (JP); Shigeo Irie, Joetsu (JP); Naoki Kawaura, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 16/033,503

(22) Filed: Jul. 12, 2018

(65) Prior Publication Data

US 2019/0033703 A1 Jan. 31, 2019

(30) Foreign Application Priority Data

Jul. 28, 2017 (JP) .............................. JP2017-146718

(51) Int. Cl.
- *G03F 1/32* (2012.01)
- *G03F 1/38* (2012.01)
- *G03F 1/50* (2012.01)
- *G03F 1/80* (2012.01)

(52) U.S. Cl.
CPC .................. *G03F 1/50* (2013.01); *G03F 1/32* (2013.01); *G03F 1/38* (2013.01); *G03F 1/80* (2013.01)

(58) Field of Classification Search
CPC ..... G03F 1/38; G03F 1/80; G03F 1/32; G03F 1/50

See application file for complete search history.

(56) References Cited

U.S. PATENT DOCUMENTS

| | | | | |
|---|---|---|---|---|
| 5,328,786 A | * | 7/1994 | Miyazaki | G03F 1/28 430/322 |
| 6,472,107 B1 | * | 10/2002 | Chan | G03F 1/76 430/313 |
| 10,564,537 B2 | * | 2/2020 | Kosaka | G03F 1/32 |
| 2005/0170655 A1 | * | 8/2005 | Bencher | G03F 1/46 430/5 |
| 2009/0253054 A1 | * | 10/2009 | Kominato | G03F 1/32 430/5 |

(Continued)

FOREIGN PATENT DOCUMENTS

| | | |
|---|---|---|
| JP | 7-49558 A | 2/1995 |
| JP | 2015-200883 A | 11/2015 |

*Primary Examiner* — Martin J Angebranndt
(74) *Attorney, Agent, or Firm* — Birch, Stewart, Kolasch & Birch, LLP.

(57) ABSTRACT

A photomask blank is provided comprising a transparent substrate, a first film of chromium-containing material on the substrate, and a second film of silicon/oxygen-containing material disposed contiguous to the first film. The second film includes a first layer contiguous to the first film and a second layer spaced apart from the first layer in film thickness direction. The oxygen content of the first layer is lower than the oxygen content of the second layer. During etching of the first film, this setting prevents an etching rate from ramping up at the interface between the first and second films.

7 Claims, 4 Drawing Sheets

(56) References Cited

U.S. PATENT DOCUMENTS

| | | | |
|---|---|---|---|
| 2011/0177436 A1* | 7/2011 | Hashimoto | G03F 1/54 |
| | | | 430/5 |
| 2013/0130160 A1* | 5/2013 | Yoshikawa | G03F 1/60 |
| | | | 430/5 |
| 2013/0309598 A1* | 11/2013 | Fukaya | G03F 1/29 |
| | | | 430/5 |
| 2015/0086908 A1* | 3/2015 | Inazuki | G03F 1/50 |
| | | | 430/5 |
| 2015/0125785 A1* | 5/2015 | Inazuki | G03F 1/32 |
| | | | 430/5 |
| 2015/0338731 A1* | 11/2015 | Nozawa | G03F 7/2006 |
| | | | 430/5 |
| 2016/0033858 A1* | 2/2016 | Kosaka | G03F 1/32 |
| | | | 430/5 |
| 2016/0291453 A1* | 10/2016 | Inazuki | G03F 1/82 |
| 2016/0291456 A1* | 10/2016 | Kosaka | G03F 1/32 |
| 2017/0139316 A1 | 5/2017 | Shishido et al. | |
| 2018/0180985 A1* | 6/2018 | Kosaka | G03F 1/80 |
| 2018/0180986 A1* | 6/2018 | Kosaka | G03F 1/54 |
| 2018/0267398 A1* | 9/2018 | Irie | G03F 1/46 |
| 2018/0356721 A1* | 12/2018 | Kosaka | G03F 1/38 |

* cited by examiner

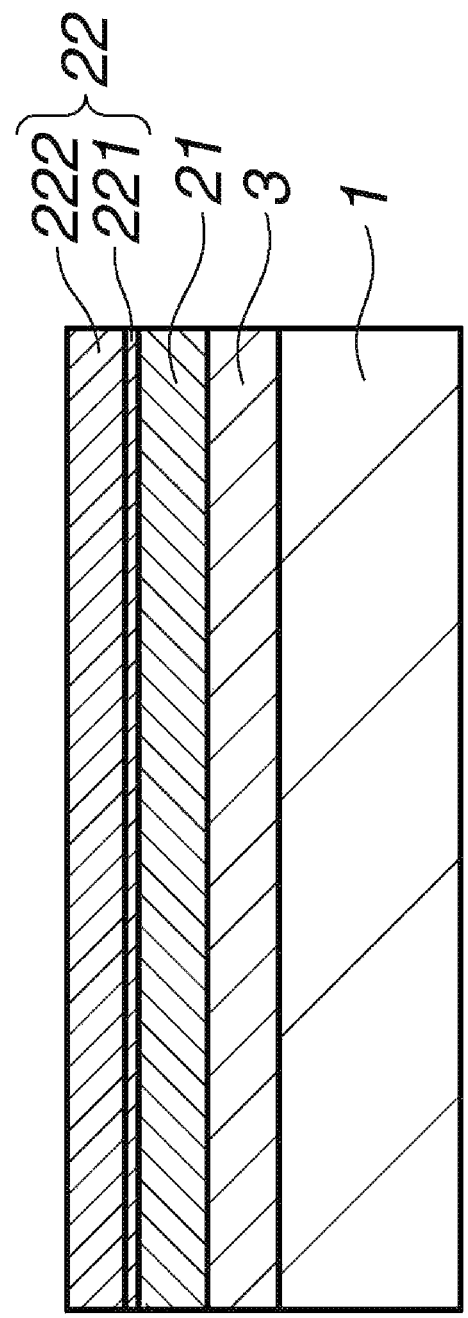

PHOTOMASK BLANK, PHOTOMASK BLANK MAKING METHOD, AND PHOTOMASK MAKING METHOD

CROSS-REFERENCE TO RELATED APPLICATION

This non-provisional application claims priority under 35 U.S.C. § 119(a) on Patent Application No. 2017-146718 filed in Japan on Jul. 28, 2017, the entire contents of which are hereby incorporated by reference.

TECHNICAL FIELD

This invention relates to photomask blanks from which photomasks for use in the micro fabrication of semiconductor integrated circuits or the like are produced, a method for preparing the photomask blank, and a method for producing a photomask from the photomask blank.

BACKGROUND ART

In the semiconductor technology field, research and development efforts continue for further miniaturization of circuit patterns. Recently, a challenge to higher integration of large-scale integrated circuits places increasing demands for further miniaturization of circuit patterns, size reduction of wiring patterns, and miniaturization of contact hole patterns for cell-constructing inter-layer connections. As a consequence, in the manufacture of photomasks for use in the photolithography of forming such fine patterns, a technique capable of accurately writing finer circuit patterns or mask patterns is needed to meet the miniaturization demand.

In general, the photolithography adopts reduction projection in forming patterns on semiconductor substrates. Thus the photomask pattern typically has a size of about 4 times the size of a pattern to be formed on the semiconductor substrate. In the currently prevailing photolithography, a circuit pattern to be written has a size far smaller than the wavelength of light used for exposure. If a photomask pattern which is a mere 4-time magnification of the circuit feature is used, the desired shape is not transferred to the resist film on semiconductor substrate due to influences such as optical interference occurring during exposure.

To mitigate such influences as optical interference, in some cases, the photomask pattern is designed to a more complex shape than the actual circuit pattern. For example, the so-called optical proximity correction (OPC) is applied to the actual circuit pattern to design a complex pattern shape. Besides, various techniques such as modified illumination, immersion lithography, and double-patterning lithography are applied to meet the demands for pattern miniaturization and high accuracy.

Photomask patterns are formed, for example, by furnishing a photomask blank having a light-shielding film on a transparent substrate, forming a photoresist film on the blank, writing a pattern with EB, developing to form a resist pattern, and etching the light-shielding film through the resist pattern serving as an etching mask, to form a light-shielding pattern. In an attempt to miniaturize the light-shielding pattern, if it is processed while maintaining the thickness of the resist film the same as before miniaturization, a ratio of film thickness to pattern size, known as aspect ratio, becomes high. Then the profile of resist pattern is degraded, pattern transfer fails and sometimes, the resist pattern can collapse or strip off. The resist film must be thinned in compliance with size reduction.

One of prior art attempts to mitigate the burden on resist film during dry etching is the use of a hard mask. For example, Patent Document 1 describes that while a light-shielding film of chromium is commonly used, a $SiO_2$ film is formed thereon as a hard mask for chromium.

CITATION LIST

Patent Document 1: JP-A H07-049558

SUMMARY OF INVENTION

In etching of a film of chromium-containing material often used as a light-shielding film, the use of a film of silicon/oxygen-containing material as a hard mask is effective for reducing the thickness of a photoresist film. However, if a film of silicon/oxygen-containing material is formed contiguous to a film of chromium-containing material, the following problem arises. When the chromium-containing material film is etched by chlorine/oxygen-based dry etching, the etching rate ramps up at the interface with the silicon/oxygen-containing material film. Such a ramp is undesirable in etching of the chromium-containing material film. Since the etching rate at the interface with the silicon/oxygen-containing material film is higher than other portions of the chromium-containing material film, side etching is promoted at the interface with the silicon/oxygen-containing material film. Even when the hard mask film is used, patterning of a chromium-containing material film fails to achieve satisfactory perpendicularity.

The invention pertains to a photomask blank comprising a film of silicon/oxygen-containing material disposed contiguous to a film of chromium-containing material. An object of the invention is to provide a photomask blank capable of preventing the rate of etching of the chromium-containing material film from ramping up at its interface with the silicon/oxygen-containing material film, and thus forming a mask pattern with improved perpendicularity from the chromium-containing material film. Another object is to provide a method for preparing the photomask blank and a method for producing a photomask from the photomask blank.

The inventors have found that the problem that a rate of etching of a chromium-containing material film ramps up at its portion in contact with a silicon/oxygen-containing material film arises for the following reason. A chromium-containing material film is altered at its interface with a silicon/oxygen-containing material film by an oxygen-containing gas used in sputter deposition of the silicon/oxygen-containing material film through the mechanism that at the start of deposition of the silicon/oxygen-containing material film and immediately thereafter, for example, at a stage before sputtered particles deposit on and fully cover the surface of the chromium-containing material film, (1) the surface of the chromium-containing material film is exposed to an oxygen-containing plasma, or (2) oxygen atoms, oxygen ions or silicon-bonded oxygen (silicon oxide) bonds with the surface of the chromium-containing material film. Typically the oxygen concentration at the interface becomes high.

The problem can be solved by forming a film of silicon/oxygen-containing material such that the oxygen content of a region of the silicon/oxygen-containing material film contiguous to a chromium-containing material film may be lower than the oxygen content of a side spaced apart from the contiguous region in film thickness direction, especially the contiguous region may be oxygen-free, for example, by constructing a silicon/oxygen-containing material film from multiple layers including a layer contiguous to the chromium-containing material film and another layer contiguous thereto, such that the oxygen content of the former layer may be lower than the oxygen content of the latter layer, especially the former layer may be oxygen-free.

The invention also pertains to a method for preparing a photomask blank comprising a film of chromium-containing material and a film of silicon/oxygen-containing material by sputter depositing the films. In the step of sputter depositing the silicon/oxygen-containing material film, the alteration by oxygen of a portion of the chromium-containing material film which lies in contact with the silicon/oxygen-containing material film is suppressed or avoided by:

(1) starting sputter deposition in an atmosphere free of an oxygen-containing gas, continuing sputtering for a predetermined time until a portion of the film is deposited, starting to feed an oxygen-containing gas at the lapse of the predetermined time, and continuing further sputtering in an atmosphere containing the oxygen-containing gas, or (2) feeding a low flow rate of an oxygen-containing gas, starting sputter deposition in an atmosphere having a low concentration of oxygen-containing gas, continuing sputtering for a predetermined time until a portion of the film is deposited, feeding a high flow rate of an oxygen-containing gas at the lapse of the predetermined time, and continuing further sputtering in an atmosphere having a high concentration of oxygen-containing gas. From the photomask blank thus obtained, a photomask is obtained by patterning the silicon/oxygen-containing material film to form a mask pattern, and processing the chromium-containing material film by chlorine/oxygen-based dry etching with a gas mixture of chlorine and oxygen gases while the mask pattern serves as an etching mask or hard mask. The chromium-containing material film is provided with a mask pattern having improved perpendicularity. The invention is predicated on these findings.

In one aspect, the invention provides a photomask blank which is processed into a transmissive photomask for use in photolithography for forming a pattern using exposure light of wavelength up to 250 nm, the photomask blank comprising a transparent substrate, a first film disposed on the substrate and formed of a chromium-containing material which is etchable by chlorine/oxygen-based dry etching with a gas mixture of chlorine and oxygen gases and resistant against fluorine-based dry etching with a fluorine-containing gas, and a second film disposed contiguous to the first film and formed of a silicon/oxygen-containing material which is not substantially etched during the chlorine/oxygen-based dry etching of the first film, the second film serving as an etching mask when the first film is patterned, the second film including a region contiguous to the first film and a side spaced apart from the contiguous region in film thickness direction, the oxygen content of the contiguous region being lower than the oxygen content of the spaced-apart side.

In a preferred embodiment, the silicon/oxygen-containing material of which the second film is formed contains one or both of nitrogen and carbon.

In a preferred embodiment, the region of the second film contiguous to the first film is free of oxygen.

In a preferred embodiment, the second film is composed of multiple layers including a first layer contiguous to the first film and a second layer contiguous to the first layer, the oxygen content of the first layer being lower than the oxygen content of the second layer.

In a preferred embodiment, the silicon/oxygen-containing material of which the second film is formed contains one or both of nitrogen and carbon.

Typically, the first layer is free of oxygen.

In a preferred embodiment, the first layer is a Si or SiN layer, and the second layer is a SiO layer.

In a preferred embodiment, the second film has a thickness of 2 to 20 nm.

In another aspect, the invention provides a method for preparing the photomask blank defined above, comprising the steps of:

placing the transparent substrate in a sputtering chamber,
depositing the first film on the substrate by sputtering, and
starting to deposit the second film by sputtering in an atmosphere free of an oxygen-containing gas, continuing sputtering for a predetermined time until a portion of the second film is deposited, starting to feed an oxygen-containing gas at the lapse of the predetermined time, and thus sputtering in an atmosphere containing the oxygen-containing gas, for thereby depositing a portion or the entirety of the remainder of the second film.

The method may further comprise, between the step of depositing the first film and the step of depositing the second film, the step of exhausting the sputtering chamber of any oxygen-containing gas.

In a further aspect, the invention provides a method for preparing the photomask blank defined above, comprising the steps of:

placing the transparent substrate in a sputtering chamber,
depositing the first film on the substrate by sputtering, and
starting to deposit the second film by feeding a low flow rate of an oxygen-containing gas and sputtering in an atmosphere having a low concentration of oxygen-containing gas, continuing sputtering for a predetermined time until a portion of the second film is deposited, feeding a high flow rate of an oxygen-containing gas at the lapse of the predetermined time, and thus sputtering in an atmosphere having a high concentration of oxygen-containing gas, for thereby depositing a portion or the entirety of the remainder of the second film.

The method may further comprise, between the step of depositing the first film and the step of depositing the second film, the step of reducing the concentration of oxygen-containing gas in the sputtering chamber.

In a still further aspect, the invention provides a method for producing a photomask comprising the steps of forming a mask pattern in the second film of the photomask blank defined above and patterning the first film by chlorine/oxygen-based dry etching with a gas mixture of chlorine and oxygen gases while the mask pattern in the second film serves as an etching mask.

Advantageous Effects of Invention

The photomask blank comprising a chromium-containing material film and a silicon/oxygen-containing material film disposed contiguous thereto has the advantage that etching of the chromium-containing material film avoids or restrains any ramp of the etching rate at the interface with the silicon/oxygen-containing material film. Thus a mask pattern with improved perpendicularity is obtainable from the chromium-containing material film.

BRIEF DESCRIPTION OF DRAWINGS

FIG. 4 is a cross-sectional view of a photomask blank in a fourth embodiment of the invention.

DESCRIPTION OF PREFERRED EMBODIMENTS

The photomask blank of the invention is processed into a transmissive photomask which is used in photolithography for forming a pattern on a recipient using exposure light of wavelength up to 250 nm, preferably up to 200 nm. As used herein, the exposure light is light used in exposure through the photomask. In conjunction with the photomask blank and photomask of the invention, the exposure light is preferably ArF excimer laser light of wavelength 193 nm.

Figure 1:
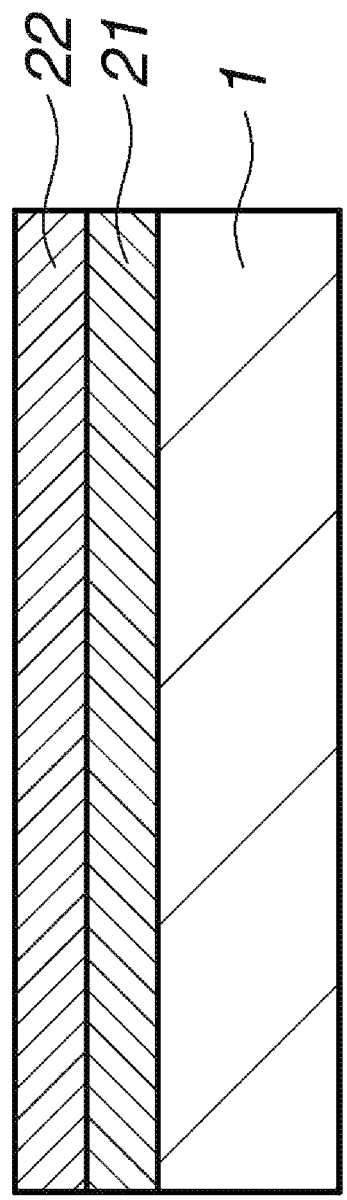
FIG. 1 is a cross-sectional view of a photomask blank in a first embodiment of the invention.

One embodiment of the invention is a photomask blank comprising a transparent substrate, a first film disposed on the substrate, and a second film disposed contiguous to the first film. Specifically, in a photomask blank (first embodiment) as shown in FIG. 1, a first film 21 and a second film 22 are formed in order on a transparent substrate 1.

The transparent substrate is typically a quartz substrate which is transparent at the exposure wavelength although the type and size of the substrate are not particularly limited. Preference is given to transparent substrates of 6 inch squares and 0.25 inch thick, known as 6025 substrate, as prescribed in the SEMI standards, or transparent substrates of 152 mm squares and 6.35 mm thick when expressed in the SI units.

Figure 2:
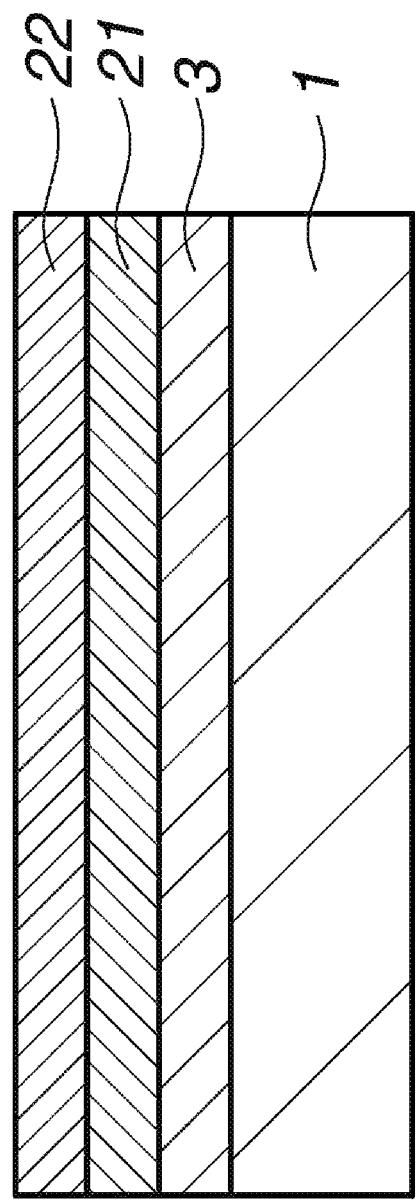
FIG. 2 is a cross-sectional view of a photomask blank in a second embodiment of the invention.

The first film may be formed either contiguous to the transparent substrate (i.e., in direct contact with the substrate) or on the transparent substrate via an intervening film such as phase shift film. In one exemplary photomask blank (second embodiment), as shown in FIG. 2, another film (third film) 3, a first film 21, and a second film 22 are formed in order on a transparent substrate 1. The other film is preferably formed of a material having different etching properties from the first film, especially a material which is etchable with fluorine-based dry etching with a fluorine-containing gas, but resistant against chlorine/oxygen-based dry etching with a gas mixture of chlorine and oxygen gases, typically a silicon-containing material. The other film may be composed of a single layer or multiple layers.

The first film may be composed of a single layer or multiple layers. Where the first film is a single layer, it may be a homogeneous layer having a constant composition in thickness direction or a compositionally graded layer having a composition continuously graded in thickness direction. Where the first film is composed of multiple layers, it may be a combination of at least one homogeneous layer and/or at least one graded layer, for example, a combination of homogeneous layers, a combination of graded layers, or a combination of a homogeneous layer and a graded layer. In the graded layer, the content of a certain element may increase or decrease in thickness direction.

The first film is formed of a chromium-containing material which is etchable by chlorine/oxygen-based dry etching with a gas mixture of chlorine and oxygen gases, but resistant against fluorine-based dry etching with a fluorine-containing gas. Suitable materials include chromium alone, and chromium compounds, for example, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

In the embodiment wherein the first film is formed of a chromium compound, the chromium content is preferably at least 30 at %, especially at least 40 at % and less than 100 at %, especially up to 90 at %. Also preferably, the oxygen content is at least 0 at %, especially at least 1 at % and up to 60 at %, especially up to 40 at %; the nitrogen content is at least 0 at %, especially at least 1 at % and up to 50 at %, especially up to 40 at %; the carbon content is at least 0 at %, especially at least 1 at % when an etching rate must be adjusted, and up to 20 at %, especially up to 10 at %. The total content of chromium, oxygen, nitrogen and carbon is preferably at least 95 at %, more preferably at least 99 at %, and especially 100 at %.

The (total) thickness of the first film is preferably at least 20 nm, more preferably at least 40 nm, and up to 100 nm, more preferably up to 70 nm. The first film is preferably constructed as an optical functional film such as a light-shielding film or antireflective film. The first film may also function as a hard mask (or etching mask) during etching of the transparent substrate or the other film (as mentioned above) on the substrate side.

The second film is formed of a silicon/oxygen-containing material which is not substantially etched during the chlorine/oxygen-based dry etching of the first film, i.e., chlorine/oxygen-based dry etching with a gas mixture of chlorine and oxygen gases. The second film in its entirety is formed of a silicon/oxygen-containing material. Preferably the material of the second film is etchable by fluorine-based dry etching with a fluorine-containing gas (e.g., $SF_6$ or $CF_4$). The second film is a film (hard mask film) which is to serve as an etching mask (hard mask) when the first film is patterned.

The second film may be composed of a single layer or multiple layers (e.g., 2 to 4 layers). Where the second film is a single layer, it may be a homogeneous layer having a constant composition in thickness direction or a compositionally graded layer having a composition continuously graded in thickness direction. Where the second film is composed of multiple layers, it may be a combination of at least one homogeneous layer and/or at least one graded layer, for example, a combination of homogeneous layers, a combination of graded layers, or a combination of a homogeneous layer and a graded layer. In the graded layer, the content of a certain element may increase or decrease in thickness direction.

Figure 3:
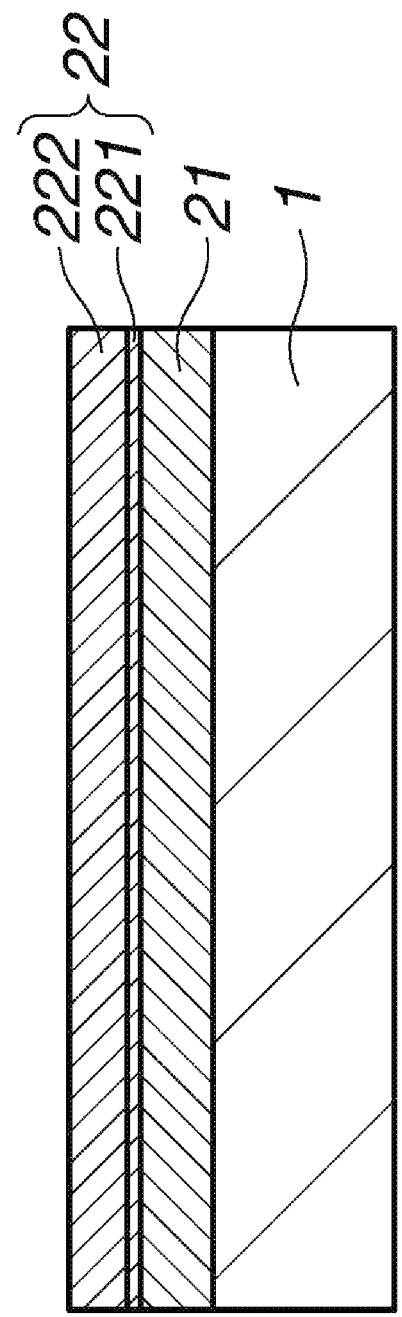
FIG. 3 is a cross-sectional view of a photomask blank in a third embodiment of the invention.

Exemplary of the photomask blank having a second film composed of multiple layers are a photomask blank (third embodiment) comprising a transparent substrate 1, a first film 21 and a second film 22 formed in order on the substrate 1, the second film 22 being composed of a first layer 221 disposed contiguous to the first film 21 and a second layer 222 disposed contiguous to the first layer 221 as shown in FIG. 3; and a photomask blank (fourth embodiment) comprising a transparent substrate 1, another film (third film) 3, a first film 21 and a second film 22 formed in order on the substrate 1, the second film 22 being composed of a first layer 221 disposed contiguous to the first film 21 and a second layer 222 disposed contiguous to the first layer 221 as shown in FIG. 4.

The silicon/oxygen-containing material of which the second film is formed may consist of silicon and oxygen, or silicon, oxygen, and one or both of nitrogen and carbon, or may further contain a transition metal. Typical of the silicon/oxygen-containing material of the second film are silicon/oxygen-containing compounds, for example, transition metal-free silicon/oxygen-containing compounds such as silicon oxide (SiO), silicon oxynitride (SiON), silicon oxycarbide (SiOC) and silicon oxide nitride carbide (SiONC), and transition metal/silicon/oxygen-containing compounds such as transition metal silicon oxide (MeSiO), transition metal silicon oxynitride (MeSiON), transition metal silicon oxycarbide (MeSiOC) and transition metal silicon oxide nitride carbide (MeSiONC). The transition metal (Me) is at least one element selected from among titanium (Ti), vanadium (V), cobalt (Co), nickel (Ni), zirconium (Zr), niobium (Nb), molybdenum (Mo), hafnium (Hf), tantalum (Ta), and tungsten (W). Of these, the transition metal-free silicon/oxygen-containing compounds are preferred for improved chemical resistance.

In the embodiment wherein the silicon/oxygen-containing material of the second film is a transition metal-free silicon/oxygen-containing compound, the silicon content is preferably at least 20 at %, more preferably at least 33 at % and up to 95 at %, more preferably up to 80 at %. Also preferably, the oxygen content is at least 20 at %, specifically at least 40 at % and up to 70 at %, especially up to 66 at %; the nitrogen content is at least 0 at %, especially at least 1 at % and up to 50 at %, especially up to 30 at %; the carbon content is at least 0 at %, especially at least 1 at % and up to 20 at %, especially up to 10 at %. The total content of silicon, oxygen, nitrogen and carbon is preferably at least 95 at %, more preferably at least 99 at %, and especially 100 at %.

In the embodiment wherein the silicon/oxygen-containing material of the second film is a transition metal/silicon/oxygen-containing compound, the silicon content is preferably at least 20 at %, more preferably at least 33 at % and up to 90 at %, more preferably up to 80 at %. Also preferably, the oxygen content is at least 10 at %, especially at least 20 at % and up to 70 at %, especially up to 66 at %; the nitrogen content is at least 0 at %, especially at least 1 at % and up to 50 at %, especially up to 30 at %; the carbon content is at least 0 at %, especially at least 1 at % and up to 20 at %, especially up to 10 at %. The transition metal content is up to 20 at %, preferably up to 15 at %, more preferably up to 10 at %. The total content of silicon, oxygen, nitrogen, carbon and transition metal is preferably at least 95 at %, more preferably at least 99 at %, and especially 100 at %.

As long as the second film is formed of a silicon/oxygen-containing material in its entirety, the second film which is of multilayer structure may consist of silicon/oxygen-containing layers, or a silicon/oxygen-containing layer and a layer containing silicon, but not oxygen. The material of the silicon/oxygen-containing layer included in the multilayer structure is typically a silicon/oxygen-containing material as exemplified above. The material of the layer containing silicon, but not oxygen may be a material containing silicon, one or both of nitrogen and carbon, and optionally a transition metal. Examples include silicon (Si) alone, transition metal-free silicon-containing compounds such as silicon nitride (SiN), silicon carbide (SiC), and silicon nitride carbide (SiNCi), and transition metal/silicon-containing compounds such as transition metal silicide (MeSi), transition metal silicon nitride (MeSiN), transition metal silicon carbide (MeSiC), and transition metal silicon nitride carbide (MeSiNC). The transition metal (Me) is at least one element selected from among titanium (Ti), vanadium (V), cobalt (Co), nickel (Ni), zirconium (Zr), niobium (Nb), molybdenum (Mo), hafnium (Hf), tantalum (Ta), and tungsten (W). Of these, the transition metal-free silicon-containing compounds are preferred for improved chemical resistance.

According to the invention, the second film includes a region contiguous to the first film and a side spaced apart from the contiguous region in film thickness direction, and the oxygen content of the contiguous region is lower than the oxygen content of the spaced-apart side, preferably the contiguous region is free of oxygen. Specifically, the second film is composed of multiple layers including a first layer disposed contiguous to the first film and a second layer disposed contiguous to the first layer, and the oxygen content of the first layer is lower than the oxygen content of the second layer, preferably the first layer is free of oxygen.

The first layer may be a layer containing silicon, but not oxygen, or a layer containing silicon and oxygen whereas the second layer is a layer containing silicon and oxygen. The first layer may be either a single layer or a multilayer structure. The first layer of multilayer structure may be composed of two or more sublayers of different composition. The thickness of the first layer is preferably up to 50%, more preferably up to 30% of the overall thickness of the second film. Specifically, the thickness of the first layer is preferably at least 1 nm, more preferably at least 2 nm and up to 10 nm, more preferably up to 6 nm, especially up to 5 nm.

Preferred examples of the layer containing silicon, but not oxygen include a Si layer and a SiN layer. Preferred examples of the layer containing silicon and oxygen include a SiO layer and a SiON layer, with the SiO layer being more preferred. Where the second film includes another layer in addition to the first and second layers, the other layer may be either a layer containing silicon and oxygen or a layer containing silicon, but not oxygen. The region contiguous to the first film or the first layer has an oxygen content of preferably up to 40 at %, more preferably up to 30 at %, even more preferably up to 10 at % and most preferably 0 at % (i.e., free of oxygen).

The overall thickness of the second film is a sufficient thickness not to vanish upon etching of the first film. It is recommended from the aspect of pattern formation that the second film be not so thick. In this sense, the second film preferably has an (overall) thickness of at least 2 nm, more preferably at least 5 nm and up to 20 nm, more preferably up to 10 nm. While the second film is formed as a hard mask film, the second film may be a film which is completely removed at the stage of a photomask, or a film which is left on a photomask, for example, on an outer periphery of the transparent substrate as a film serving for part of light-shielding film or antireflective film function.

In the embodiment wherein the first film is formed on the transparent substrate via another film (third film), the other film is formed of a silicon-containing material. Examples of the silicon-containing material include silicon-containing compounds, for example, silicon-containing compounds containing silicon and one or both of oxygen and nitrogen, such as silicon oxide (SiO), silicon nitride (SiN), and silicon oxide nitride (SiON), and transition metal silicon compounds, for example, compounds containing a transition metal (Me), silicon and one or more light elements of oxygen, nitrogen and carbon, such as transition metal silicon oxide (MeSiO), transition metal silicon nitride (MeSiN), transition metal silicon carbide (MeSiC), transition metal silicon oxide nitride (MeSiON), transition metal silicon oxide carbide (MeSiOC), transition metal silicon nitride carbide (MeSiNC), and transition metal silicon oxide nitride carbide (MeSiONC). The transition metal (Me) is at least one element selected from among titanium (Ti), vanadium (V), cobalt (Co), nickel (Ni), zirconium (Zr), niobium (Nb), molybdenum (Mo), hafnium (Hf), tantalum (Ta), and tungsten (W). Of these, molybdenum (Mo) is preferred from the standpoint of dry etching.

In the embodiment wherein the other film is a phase shift film, it may be either a full transmissive phase shift film or a halftone phase shift film, for example, having a transmittance of 5 to 30% with respect to exposure light. The phase shift film is generally formed to such a thickness as to provide a phase shift of predetermined value, specifically a phase shift of at least 150°, preferably at least 170° and up to 200°, preferably up to 190°, typically a phase shift of 180° with respect to exposure light during use of the photomask. Specifically, the other film preferably has a thickness of at least 50 nm, more preferably at least 55 nm and up to 80 nm, more preferably up to 75 nm.

In one embodiment wherein the first film in the form of a light-shielding film or a light-shielding film and antireflective film is directly formed on the transparent substrate, the photomask blank may be a binary photomask blank. In another embodiment wherein the first film is formed on the transparent substrate via the other film in the form of a phase shift film, the photomask blank may be a phase shift photomask blank. From the binary photomask blank, a binary photomask (or binary mask) may be manufactured. From the phase shift photomask blank, a phase shift photomask (or phase shift mask) may be manufactured.

When the photomask blank is manufactured by forming a first film, a second film, and optionally another (third) film on a transparent substrate, the single layer or each of the multiple layers of which the first film, second film or other film is composed is preferably deposited by a sputtering technique because a fully homogeneous film is readily obtained. The sputtering technique may be either DC sputtering or RF sputtering. The target and sputtering gas are selected as appropriate depending on the layer arrangement and composition. When the film is formed by reactive sputtering, the content of light elements (e.g., oxygen, nitrogen, carbon) may be adjusted by using a reactive gas as the sputtering gas and adjusting the flow rate thereof. Suitable reactive gases include oxygen-containing gas, nitrogen-containing gas and carbon-containing gas, for example, oxygen gas ($O_2$ gas), nitrogen gas ($N_2$ gas), nitrogen oxide gas (NO gas, $N_2O$ gas, $NO_2$ gas), and carbon oxide gas (CO gas, $CO_2$ gas). The sputtering gas contains an inert gas such as helium, neon or argon gas. The preferred inert gas is argon gas. The sputtering pressure is typically at least 0.01 Pa, preferably at least 0.03 Pa and up to 10 Pa, preferably up to 0.1 Pa.

On sputter deposition, different films or layers may be deposited in different sputtering chambers or in a common sputtering chamber while changing sputtering conditions stepwise or continuously.

When a film of chromium-containing material or a layer thereof is deposited as the first film, the target may be selected from a chromium target and a target containing chromium and at least one element selected from oxygen, nitrogen and carbon, depending on the desired composition of the film or layer. When a film of silicon/oxygen-containing material or a layer thereof (silicon/oxygen-containing layer, oxygen-free silicon-containing layer) is deposited as the second film or when a film of silicon-containing material or a layer thereof is deposited as the other (third) film, the target may be selected from a silicon target, transition metal target, and transition metal/silicon target, depending on the desired composition of the film or layer.

The photomask blank of the invention is characterized in that the oxygen content of the region (typically first layer) of the second film which is disposed contiguous to the first film is lower than the oxygen content of the side (typically second layer) which is spaced apart from the contiguous region in film thickness direction, preferably the contiguous region (typically first layer) is free of oxygen. The photomask blank having the specific second film may be prepared by the following method.

The method involves the steps of placing the transparent substrate in a sputtering chamber, and depositing the first film on the substrate by sputtering. That is, the transparent substrate is first placed in a sputtering chamber, and the first film is deposited on the substrate by sputtering. The subsequent steps include (1) starting to deposit the second film by sputtering in an atmosphere free of an oxygen-containing gas, continuing sputtering for a predetermined time until a portion of the second film is deposited, starting to feed an oxygen-containing gas at the lapse of the predetermined time, and thus sputtering in an atmosphere containing an oxygen-containing gas, for thereby depositing a portion or the entirety of the remainder of the second film; or (2) starting to deposit the second film by feeding a low flow rate of an oxygen-containing gas and sputtering in an atmosphere having a low concentration of oxygen-containing gas, continuing sputtering for a predetermined time until a portion of the second film is deposited, feeding a high flow rate of an oxygen-containing gas at the lapse of the predetermined time (i.e., a higher flow rate than the flow rate used until the predetermined time), and thus sputtering in an atmosphere having a high concentration of oxygen-containing gas (i.e., a higher concentration than the level used until the predetermined time), for thereby depositing a portion or the entirety of the remainder of the second film.

Herein, a portion or the entirety of the remainder of the second film is deposited after the lapse of the predetermined time. When a portion of the remainder of the second film is deposited, the second film is constructed of three or more layers. That is, after a portion of the remainder of the second film is deposited, the remaining layer(s) may be sputter deposited depending on the construction and composition thereof. The predetermined time from the start of deposition of the second film, that is, the predetermined time after a portion of the second film is deposited and until the start to feed an oxygen-containing gas or to feed a high flow rate of an oxygen-containing gas varies depending on the time taken for deposition of the overall second film, and is preferably at least 10%, especially at least 20% and up to 60%, especially up to 50% of the time taken for deposition of the overall second film. Specifically, the predetermined time may be, for example, at least 10 seconds, especially at least 20 seconds, and up to 50 seconds, especially up to 40 seconds.

At the stage from the start of deposition of a film of silicon/oxygen-containing material as the second film to immediately thereafter, for example, at the stage before sputtered particles deposit on a film of chromium-containing material and cover its surface, an oxygen-containing gas as the sputtering gas (reactive gas) is not fed or fed at a low flow rate, thus sputtering is carried out in an atmosphere not containing an oxygen-containing gas or containing an oxygen-containing gas in a low concentration, thereby depositing the second film such that the oxygen content of the region (typically first layer) of the second film which is disposed contiguous to the first film is lower than the oxygen content of the side (typically second layer) which is spaced apart from the contiguous region in film thickness direction, preferably the contiguous region (typically first layer) is free of oxygen.

In a preferred embodiment, the step of exhausting the sputtering chamber of any oxygen-containing gas is interposed between the step of depositing the first film and the step of depositing the second film. This is preferred when the second film is deposited such that the region (typically first layer) of the second film contiguous to the first film is free of oxygen. In another preferred embodiment, the step of reducing the concentration of oxygen-containing gas in the sputtering chamber is interposed between the step of depositing the first film and the step of depositing the second film. This is preferred when the second film is deposited such that the oxygen content of the region (typically first layer) of the second film contiguous to the first film is lower than the oxygen content of the side (typically second layer) of the second film spaced apart from the contiguous region in film thickness direction.

The photomask blank may be processed into a photomask by etching the second film, the first film, the optional third film, and the substrate in any well-known manner to form a photomask pattern. Specifically, the first film is processed by chlorine/oxygen based dry etching with a gas mixture of chlorine and oxygen gases while a mask pattern of the second film serves as an etching mask. A mask pattern with improved perpendicularity may be formed from a film of chromium-containing material as the first film.

EXAMPLE

Examples and Comparative Examples are given below by way of illustration and not by way of limitation. Notably a film composition was analyzed by X-ray photoelectron spectrometer XPS K-Alpha (Thermo Fisher Scientific).

Example 1

In a chamber of a sputtering system, a 6025 quartz substrate of 152 mm squares and 6.35 mm thick was placed. By sputtering a chromium target with argon gas and nitrogen gas ($N_2$ gas) as sputtering gas, a monolayer CrN film of 10 nm thick (Cr:N=85:15 in atomic ratio) was deposited as a first film on the substrate. Next, by sputtering a silicon target with argon gas as sputtering gas, a Si layer of 3 nm thick was deposited as a first layer. After the lapse of 8 seconds from the start of sputtering to form a Si layer, oxygen gas ($O_2$ gas) was introduced into the chamber, whereby a $SiO_2$ layer of 7 nm was deposited as a second layer. In this way, the second film formed of silicon/oxygen containing material as a whole was deposited to a thickness of 10 nm, completing a photomask blank.

The second film was etched and completely removed by a fluorine-based dry etching process including using an etching apparatus including two radio frequency power supplies (RF1 and RF2), subjecting RF1 to continuous discharge (CW) 54 W by reactive ion etching (RIE) and RF2 to continuous discharge (CW) 325 W by inductively coupled plasma (ICP), setting a pressure of 5 mTorr (0.67 Pa) in the etching chamber, and feeding $SF_6$ gas at a flow rate of 18 sccm and oxygen gas ($O_2$ gas) at a flow rate of 45 sccm. Then the first film was etched by a chlorine/oxygen-based dry etching process including using an etching apparatus including two radio frequency power supplies (RF1 and RF2), subjecting RF1 to continuous discharge (CW) 700 V by reactive ion etching (RIE) and RF2 to continuous discharge (CW) 400 W by inductively coupled plasma (ICP), setting a pressure of 6 mTorr (0.80 Pa) in the etching chamber, and feeding chlorine gas ($Cl_2$ gas) at a flow rate of 185 sccm, oxygen gas ($O_2$ gas) at a flow rate of 55 sccm, and helium gas (He gas) at a flow rate of 9.25 sccm. The etching rate was 0.231 nm/sec on the average across the film thickness of 10 nm.

Example 2

In a chamber of a sputtering system, a 6025 quartz substrate of 152 mm squares and 6.35 mm thick was placed. By the same procedure as in Example 1, a monolayer CrN film of 10 nm thick (Cr:N=85:15 in atomic ratio) was deposited as a first film on the substrate. Next, by sputtering a silicon target with argon gas and nitrogen gas ($N_2$ gas) as sputtering gas, a SiN layer of 3 nm thick (Si:N=63:37 in atomic ratio) was deposited as a first layer. After the lapse of 20 seconds from the start of sputtering to form a SiN layer, the supply of nitrogen gas ($N_2$ gas) was interrupted and oxygen gas ($O_2$ gas) was introduced into the chamber, whereby a $SiO_2$ layer of 7 nm was deposited as a second layer. In this way, the second film formed of silicon/oxygen-containing material as a whole was deposited to a thickness of 10 nm, completing a photomask blank.

Next, the second film was etched and completely removed by fluorine-based dry etching as in Example 1. Then the first film was etched by chlorine/oxygen based dry etching as in Example 1. The etching rate was 0.238 nm/sec on the average across the film thickness of 10 nm.

Example 3

In a chamber of a sputtering system, a 6025 quartz substrate of 152 mm squares and 6.35 mm thick was placed. By the same procedure as in Example 1, a monolayer CrN film of 10 nm thick (Cr:N=85:15 in atomic ratio) was deposited as a first film on the substrate. Next, by sputtering a silicon target with argon gas and oxygen gas ($O_2$ gas) as sputtering gas, a SiO layer of 3 nm thick (Si:O=46:54 in atomic ratio) was deposited as a first layer. After the lapse of 20 seconds from the start of sputtering to form a SiO layer, the flow rate of oxygen gas ($O_2$ gas) into the chamber was increased, whereby a $SiO_2$ layer of 7 nm thick was deposited as a second layer. In this way, the second film formed of silicon/oxygen-containing material as a whole was deposited to a thickness of 10 nm, completing a photomask blank.

Next, the second film was etched and completely removed by fluorine-based dry etching as in Example 1. Then the first film was etched by chlorine/oxygen-based dry etching as in Example 1. The etching rate was 0.237 nm/sec on the average across the film thickness of 10 nm.

Example 4

In a chamber of a sputtering system, a 6025 quartz substrate of 152 mm squares and 6.35 mm thick was placed. By the same procedure as in Example 1, a monolayer CrN film of 10 nm thick (Cr:N=85:15 in atomic ratio) was deposited as a first film on the substrate. Next, by sputtering a silicon target with argon gas and oxygen gas ($O_2$ gas) as sputtering gas, a SiO layer of 3 nm thick (Si:O=67:33 in atomic ratio) was deposited as a first layer. After the lapse of 22 seconds from the start of sputtering to form a SiO layer, the flow rate of oxygen gas ($O_2$ gas) into the chamber was increased, whereby a $SiO_2$ layer of 7 nm thick was deposited as a second layer. In this way, the second film formed of silicon/oxygen-containing material as a whole was deposited to a thickness of 10 nm, completing a photomask blank.

Next, the second film was etched and completely removed by fluorine-based dry etching as in Example 1. Then the first film was etched by chlorine/oxygen-based dry etching as in Example 1. The etching rate was 0.246 nm/sec on the average across the film thickness of 10 nm.

Comparative Example

In a chamber of a sputtering system, a 6025 quartz substrate of 152 mm squares and 6.35 mm thick was placed. By the same procedure as in Example 1, a monolayer CrN film of 10 nm thick (Cr:N=85:15 in atomic ratio) was deposited as a first film on the substrate. Next, by sputtering a silicon target with argon gas and oxygen gas ($O_2$ gas) as sputtering gas, a $SiO_2$ layer of 10 nm thick was deposited as a second film. A photomask blank was completed.

Next, the second film was etched and completely removed by fluorine-based dry etching as in Example 1. Then the first film was etched by chlorine/oxygen-based dry etching as in Example 1. The etching rate was 0.258 nm/sec on the average across the film thickness of 10 nm.

As seen from Examples and Comparative Example, the photomask blanks of Examples show a lower etching rate than the photomask blank of Comparative Example. The alteration by oxygen of the chromium-containing material film at its interface with the silicon/oxygen-containing material film is suppressed or avoided. It is demonstrated that by subjecting the first film to chlorine/oxygen based dry etching, a mask pattern with improved perpendicularity is formed from the first film.

Japanese Patent Application No. 2017-146718 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank which is processed into a transmissive photomask for use in photolithography for forming a pattern using exposure light of wavelength up to 250 nm, the photomask blank comprising
    a transparent substrate,
    a first film disposed on the substrate and formed of a chromium-containing material which is etchable by chlorine/oxygen-based dry etching with a gas mixture of chlorine and oxygen gases and resistant against fluorine-based dry etching with a fluorine-containing gas, and
    a second film disposed contiguous to the first film and formed of a silicon/oxygen-containing material which is not substantially etched during the chlorine/oxygen-based dry etching of the first film, the second film serving as an etching mask when the first film is patterned,
    the second film including a region contiguous to the first film and a side spaced apart from the contiguous region in film thickness direction, the oxygen content of the contiguous region being lower than the oxygen content of the spaced-apart side, wherein
    the second film comprises multiple layers including a first layer contiguous to the first film and a second layer contiguous to the first layer, the first layer being a SiN layer, the second layer being a SiO layer, and
    the second film has a thickness of 2 to 10 nm.

2. The photomask blank of claim 1 wherein a thickness of the first layer is up to 50% of the overall thickness of the second film.

3. The photomask blank of claim 1 wherein a thickness of the first layer is up to 30% of the overall thickness of the second film.

4. The photomask blank of claim 1 wherein the first layer has a thickness of 1 to 5 nm.

5. A method for preparing the photomask blank of claim 1, comprising the steps of:
    placing the transparent substrate in a sputtering chamber,
    depositing the first film on the substrate by sputtering, and
    starting to deposit the second film by sputtering in an atmosphere free of an oxygen-containing gas, continuing sputtering for a predetermined time until a portion of the second film is deposited, starting to feed an oxygen-containing gas at the lapse of the predetermined time, and thus sputtering in an atmosphere containing the oxygen-containing gas, for thereby depositing a portion or the entirety of the remainder of the second film.

6. The method of claim 5, further comprising, between the step of depositing the first film and the step of depositing the second film, the step of exhausting the sputtering chamber of any oxygen-containing gas.

7. A method for producing a photomask comprising the steps of:
    forming a mask pattern in the second film of the photomask blank of claim 1 and
    patterning the first film by chlorine/oxygen-based dry etching with a gas mixture of chlorine and oxygen gases while the mask pattern in the second film serves as an etching mask.

* * * * *